(12) United States Patent
Otsuka et al.

(10) Patent No.: US 8,802,348 B2
(45) Date of Patent: Aug. 12, 2014

(54) RADIATION-SENSITIVE RESIN COMPOSITION

(75) Inventors: Noboru Otsuka, Tokyo (JP); Takanori Kawakami, Tokyo (JP); Yukio Nishimura, Tokyo (JP); Makoto Sugiura, Tokyo (JP)

(73) Assignee: JSR Corporation, Tokyo (JP)

( * ) Notice: Subject to any disclaimer, the term of this patent is extended or adjusted under 35 U.S.C. 154(b) by 183 days.

(21) Appl. No.: 12/701,592

(22) Filed: Feb. 7, 2010

(65) Prior Publication Data

US 2010/0203447 A1 Aug. 12, 2010

Related U.S. Application Data

(63) Continuation of application No. PCT/JP2008/063702, filed on Jul. 30, 2008.

(30) Foreign Application Priority Data

Aug. 9, 2007 (JP) ................................. 2007-208631

(51) Int. Cl.
G03F 7/039 (2006.01)
G03F 7/20 (2006.01)
G03F 7/30 (2006.01)
G03F 7/38 (2006.01)

(52) U.S. Cl.
USPC ........ 430/270.1; 430/311; 430/326; 430/330; 430/910

(58) Field of Classification Search
None
See application file for complete search history.

(56) References Cited

U.S. PATENT DOCUMENTS

| 4,491,628 | A | 1/1985 | Ito et al. | |
|---|---|---|---|---|
| 7,316,886 | B2 | 1/2008 | Kanda | |
| 2001/0018162 | A1* | 8/2001 | Hatakeyama et al. | ..... 430/270.1 |
| 2002/0102492 | A1* | 8/2002 | Iwai et al. | ................... 430/270.1 |
| 2002/0147291 | A1* | 10/2002 | Watanabe | ...................... 526/273 |
| 2003/0059715 | A1 | 3/2003 | Sato | |
| 2005/0014095 | A1* | 1/2005 | Yamaguchi et al. | ........ 430/270.1 |
| 2005/0147920 | A1* | 7/2005 | Lin et al. | ........................ 430/311 |
| 2007/0042289 | A1* | 2/2007 | Thackeray et al. | ......... 430/270.1 |

FOREIGN PATENT DOCUMENTS

| EP | 0159428 | 10/1985 |
|---|---|---|
| EP | 0454334 | 10/1991 |
| JP | 59-045439 | 3/1984 |
| JP | 59-093448 | 5/1984 |
| JP | 04-226461 | 8/1992 |
| JP | 07-234511 | 9/1995 |
| JP | 2005-352384 | 12/2005 |
| TW | 571179 | 1/2004 |
| TW | 200728920 | 8/2007 |
| WO | WO 2008/087840 A1 * | 7/2008 |

OTHER PUBLICATIONS

Derwent English abstract for WO 2008/087840 (Jul. 2008).*
Chinese Office Action for corresponding CN Application No. 200880101869.8, Aug. 22, 2011.
Taiwanese Office Action for corresponding TW Application No. 097130073, Aug. 8, 2013.

* cited by examiner

*Primary Examiner* — Sin J. Lee
(74) *Attorney, Agent, or Firm* — Dittavong & Steiner, P.C.

(57) ABSTRACT

A radiation-sensitive resin composition includes (A) an acid labile group-containing resin which becomes alkali-soluble by an action of an acid, (B) a radiation-sensitive acid generator, and (C) a solvent. The resin (A) includes repeating units shown by formulas (1) and (2), wherein $R^1$ and $R^2$ represent a hydrogen atom or a substituted or unsubstituted alkyl group having 1 to 4 carbon atoms, $R^3$ represents a substituted or unsubstituted alkyl group having 1 to 4 carbon atoms, X represents a hydrogen atom, a hydroxyl group, or an acyl group, m represents an integer from 1 to 18, and n represents an integer from 4 to 8.

10 Claims, No Drawings

RADIATION-SENSITIVE RESIN COMPOSITION

CROSS-REFERENCE TO RELATED APPLICATIONS

The present application is a continuation application of International Application No. PCT/JP2008/063702, filed Jul. 30, 2008, which claims priority to Japanese Patent Application No. 2007-208631, filed Aug. 9, 2007. The contents of these applications are incorporated herein by reference in their entirety.

BACKGROUND OF THE INVENTION

1. Field of the Invention

The present invention relates to a radiation-sensitive resin composition and a pattern forming method.

2. Discussion of the Background

In the field of microfabrication represented by the manufacture of integrated circuit devices, lithographic technology enabling microfabrication with a line width of 0.20 μm or less has been demanded in recent years in order to increase the degree of integration. In a conventional lithographic process, near ultraviolet rays such as i-line radiation have been generally used. However, it is difficult to perform microfabrication with a line width of sub-quarter micron using near ultraviolet rays. Therefore, in order to enable microfabrication with a line width of 0.20 μm or less, utilization of radiation with a shorter wavelength has been studied.

As examples of such short wavelength radiation, a bright line spectrum of a mercury lamp, deep ultraviolet rays represented by excimer lasers, X rays, electron beams, and the like can be given. A KrF excimer laser (wavelength: 248 nm) or an ArF excimer laser (wavelength: 193 nm) are given particular attention.

As a resist applicable to such excimer laser radiation, a number of resists utilizing a chemical amplification effect between a component having an acid labile functional group and a component which generates an acid upon exposure to radiation (hereinafter referred to simply as "exposure") have been proposed. The component which generates an acid upon exposure is hereinafter referred to as "acid generator" and the resist utilizing a chemical amplification effect is hereinafter referred to as "chemically-amplified resist".

As a chemically-amplified resist, a resist containing a polymer having a t-butyl ester group of carboxylic acid or a t-butyl carbonate group of phenol and an acid generator has been proposed (see Japanese Patent Application Publication (KOKAI) No. 59-45439). In such a resist, the t-butoxycarbonyl group or t-butyl carbonate group in the polymer dissociates by the action of an acid generated upon exposure, whereby the polymer has an acidic group such as a carboxylic group or a phenolic hydroxyl group. As a result, exposed areas of the resist film become readily soluble in an alkaline developer.

Many general chemically-amplified resists contain a phenolic base resin. If such a resin is used, deep ultraviolet rays used as radiation for exposure are absorbed in the resin due to an aromatic ring contained therein and cannot sufficiently reach the lower layers of the resist film. Because of this, the amount of radiation is greater in the upper layers and is smaller in the lower layers of the resist film. This causes a resist pattern profile to have a trapezoid shape having a thin upper portion and a thick lower portion after development. No sufficient resolution can be obtained from such a resist film. Such a trapezoid resist pattern profile formed after development cannot give a desirable dimensional accuracy in the succeeding steps such as an etching step and an ion implantation step. In addition, if the resist pattern profile is not a rectangle in which the upper side and the sidewall make almost right angle, the resist disappears faster during dry etching, making it difficult to control etching conditions.

A resist pattern profile can be improved by increasing the radiation transmittance through the resist film. A (meth)acrylate resin represented by polymethylmethacrylate is a highly desirable resin from the viewpoint of radiation transmittance, because the (meth)acrylate resin has high transparency to deep ultraviolet rays. For example, a chemically-amplified resist using a methacrylate resin has been proposed (see Japanese Patent Application Publication (KOKAI) No. 4-226461).

However, this composition has insufficient dry etching resistance due to the absence of an aromatic ring, although the composition excels in microfabrication performance. It is difficult to perform etching with high accuracy using this resin composition. Thus, the composition cannot be regarded as having both transparency to radiation and dry etching resistance.

As a means to improve dry etching resistance of the chemically-amplified resist without impairing transparency to radiation, a method of introducing an aliphatic ring into a resin component in the resist instead of an aromatic ring is known. For example, a chemically-amplified resist using a (meth)acrylate resin having an aliphatic ring has been proposed (see Japanese Patent Application Publication (KOKAI) No. 7-234511).

As acid labile functional groups, this resist includes a resin having a group which is comparatively easily dissociated with a general acid (e.g. an acetal functional group such as a tetrahydropyranyl group) and a group which is comparatively difficult to be dissociated with an acid (e.g. a t-butyl functional group such as a t-butyl ester group and t-butylcarbonate group). However, the resin component having the former functional group which is comparatively easily dissociated with a general acid has a problem of poor storage stability, although the basic resist properties such as sensitivity and pattern profile are excellent. On the other hand, the resin component having the latter functional group which is dissociated with an acid only with difficulty has excellent storage stability, but its basic resist properties, particularly sensitivity and pattern profile, are poor. Moreover, inclusion of an aliphatic ring in the resin component of this resist results in poor adhesion to substrates due to an extreme increase in hydrophobicity of the resin.

When forming a resist pattern by using a chemically-amplified resist, the resist is usually treated with heat after exposure in order to promote dissociation of the acid labile functional group. In such a case, fluctuation of the resist pattern line width due to fluctuation of the heating temperature is unavoidable. However, in order to respond to miniaturization of the integrated circuit devices in recent years, development of a resist having only small temperature dependency, that is, a resist which shows only small fluctuation in the line width due to the fluctuation of the heating temperature after exposure, has been demanded.

In addition, an acid generator is known to significantly affect the functions of a chemically-amplified resist. Presently, onium salt compounds which generate an acid at a high quantum yield and exhibit high sensitivity upon exposure are widely used as an acid generator for chemically-amplified resists. As such onium salt compounds, triphenylsulfonium hexafluoroantimonate, triphenylsulfonium naphthalenesulfonate, cyclohexylmethyl(2-oxocyclohexyl)sulfonium trifluoromethanesulfonate, and the like are used.

Most of these conventional onium salt compounds, however, do not exhibit satisfactory sensitivity. Although some compounds may exhibit comparatively high sensitivity, they are not necessarily satisfactory in overall resist performance such as resolution, pattern profile, and the like.

SUMMARY OF THE INVENTION

According to one aspect of the present invention, a radiation-sensitive resin composition includes (A) an acid labile group-containing resin which becomes alkali-soluble by an action of an acid, (B) a radiation-sensitive acid generator, and (C) a solvent. The resin (A) includes repeating units shown by formulas (1) and (2),

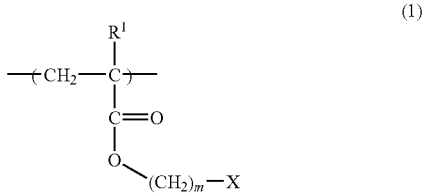

wherein $R^1$ represents a hydrogen atom or a substituted or unsubstituted alkyl group having 1 to 4 carbon atoms, X represents a hydrogen atom, a hydroxyl group, or an acyl group, and m represents an integer from 1 to 18,

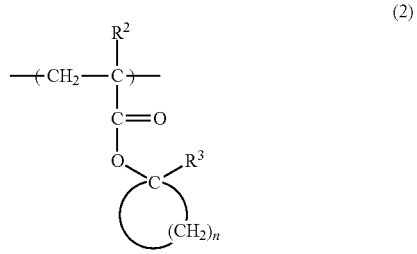

wherein $R^2$ represents a hydrogen atom or a substituted or unsubstituted alkyl group having 1 to 4 carbon atoms, $R^3$ represents a substituted or unsubstituted alkyl group having 1 to 4 carbon atoms, and n represents an integer from 4 to 8.

According to another aspect of the present invention, a pattern forming method includes applying the composition described above to a substrate to form a resist film, and exposing and developing the resist film.

DESCRIPTION OF THE EMBODIMENTS

The embodiment of the present invention will now be described in detail. In the embodiment of the present invention, (meth)acryl means acryl and methacryl, and (meth)acrylate means acrylate and methacrylate.

The composition of the embodiment of the present invention includes (A) an acid labile group-containing resin which becomes soluble in alkali by the action of an acid, (B) a radiation-sensitive acid generator, and (C) a solvent.

[1] Acid Labile Group-Containing Resin which Becomes Alkali-Soluble by Action of Acid The acid labile group-containing resin (hereinafter referred to from time to time as "resin (A)") is a resin insoluble or scarcely soluble in alkali, but becomes alkali-soluble by the action of an acid. The term "alkali-insoluble" or "scarcely alkali-soluble" used herein indicates the following properties of a resin. Specifically, in the case of developing a film using only the resin (A) instead of a resist film under the alkaline development conditions employed when forming a resist pattern of the resist film formed from the radiation-sensitive resin composition containing the resin (A), the term "alkali-insoluble" or "scarcely alkali-soluble" refers to properties in which 50% or more of the initial thickness of the resist film remains after development.

The resin (A) contains a repeating unit shown by the following formula (1) (hereinafter referred to as "repeating unit (1)") and a repeating unit shown by the following formula (2) (hereinafter referred to as "repeating unit (2)").

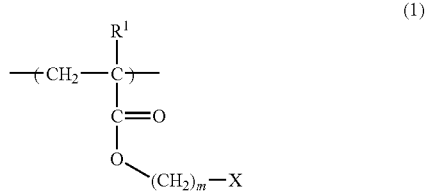

wherein $R^1$ represents a hydrogen atom or a substituted or unsubstituted alkyl group having 1 to 4 carbon atoms, X represents a hydrogen atom, a hydroxyl group, or an acyl group, and m represents an integer from 1 to 18,

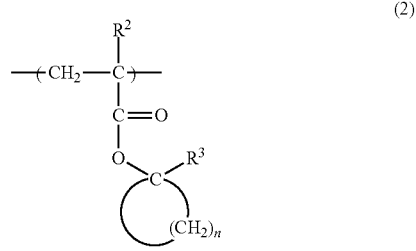

wherein $R^2$ represents a hydrogen atom or a substituted or unsubstituted alkyl group having 1 to 4 carbon atoms, $R^3$ represents a substituted or unsubstituted alkyl group having 1 to 4 carbon atoms, and n represents an integer from 4 to 8.

As examples of the substituted or unsubstituted alkyl group having 1 to 4 carbon atoms represented by $R^1$ in the formula (1), a methyl group, an ethyl group, an n-propyl group, an i-propyl group, an n-butyl group, a 2-methylpropyl group, a 1-methylpropyl group, and a t-butyl group can be given.

As examples of the acyl group represented by X in the formula (1), a formyl group, an acetyl group, a propionyl group, a butyryl group, an iso-butyryl group, a valeryl group, an iso-valeryl group, a pivaloyl group, and a hexanoyl group can be given.

m in the formula (1) represents an integer from 1 to 18, preferably 1 to 10, and more preferably 1 to 5.

As specific examples of a monomer providing the repeating unit (1), the compound (M-1-1) and the compound (M-1-2) shown by the following formulas can be given. In the following formulas, $R^1$ is the same as the $R^1$ in the above formula (1), and represents a hydrogen atom or a methyl group.

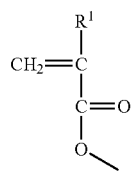
(M-1-1)

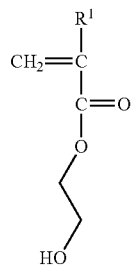
(M-1-2)

The above description for $R^1$ in the formula (1) applies to the substituted or unsubstituted alkyl group having 1 to 4 carbon atoms represented by $R^2$ and $R^3$ in the above formula (2).

n in the formula (2) is an integer from 4 to 8, and preferably an integer from 4 to 7.

As specific examples of a monomer providing the repeating unit (2), the compound (M-2-1) and the compound (M-2-2) shown by the following formulas can be given. In the following formulas, $R^2$ is the same as the $R^2$ in the above formula (2), and represents a hydrogen atom or a methyl group.

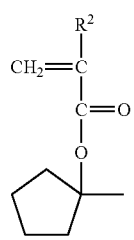
(M-2-1)

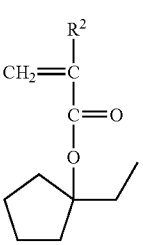
(M-2-2)

The resin (A) may have one type of the repeating unit (1) or two or more types of the repeating unit (1). The resin (A) may have one type of the repeating unit (2) or two or more types of the repeating unit (2). Furthermore, the resin (A) may have repeating units other than the repeating unit (1) and the repeating unit (2).

As examples of such other repeating units, repeating units shown by the following formulas (3-1) to (3-4) and a repeating unit having a lactone skeleton can be given.

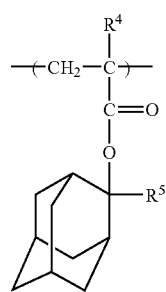
(3-1)

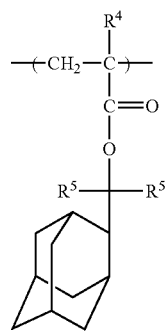
(3-2)

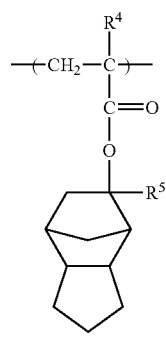
(3-3)

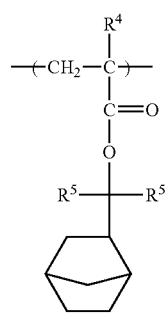
(3-4)

wherein $R^4$ represents a hydrogen atom or a substituted or unsubstituted alkyl group having 1 to 4 carbon atoms, $R^5$ represents a substituted or unsubstituted alkyl group having 1 to 4 carbon atoms, and, if plural $R^5$ groups exist in a single repeating unit among the repeating units, the plural $R^5$ groups are either same or different.

As the repeating unit having the lactone skeleton, units obtained by cleavage of a polymerizable unsaturated bond of a compound such as 5-oxo-4-oxa-tricyclo[4.2.1.0$^{3,7}$]non-2-yl(meth)acrylate, 9-methoxycarbonyl-5-oxo-4-oxa-tricyclo[5.2.1.0$^{3,7}$]non-2-yl(meth)acrylate, 5-oxo-4-oxa-tricyclo[5.2.1.0$^{3,8}$]dec-2-yl(meth)acrylate, 10-methoxycarbonyl-5-oxo-4-oxa-tricyclo[5.2.1.0$^{3,8}$]non-2-yl(meth)acrylate, 6-oxo-7-oxa-bicyclo[3.2.1]oct-2-yl(meth)acrylate, 4-methoxycarbonyl-6-oxo-7-oxa-bicyclo[3.2.1]oct-2-yl(meth)

acrylate, 7-oxo-8-oxa-bicyclo[3.3.1]oct-2-yl(meth)acrylate, 4-methoxycarbonyl-7-oxo-8-oxa-bicyclo[3.3.1]oct-2-yl (meth)acrylate, 2-oxotetrahydropyran-4-yl(meth)acrylate, 4-methyl-2-oxotetrahydropyran-4-yl(meth)acrylate, 4-ethyl-2-oxotetrahydropyran-4-yl(meth)acrylate, 4-propyl-2-oxotetrahydropyran-4-yl(meth)acrylate, 5-oxotetrahydrofuran-3-yl(meth)acrylate, 2,2-dimethyl-5-oxotetrahydrofuran-3-yl(meth)acrylate, 4,4-dimethyl-5-oxotetrahydrofuran-3-yl(meth)acrylate, 2-oxotetrahydrofuran-3-yl(meth)acrylate, 4,4-dimethyl-2-oxotetrahydrofuran-3-yl(meth)acrylate, 5,5-dimethyl-2-oxotetrahydrofuran-3-yl(meth)acrylate, 2-oxotetrahydrofuran-3-yl(meth)acrylate, methyl 5-oxotetrahydrofuran-2-yl(meth)acrylate, methyl 3,3-dimethyl-5-oxotetrahydrofuran-2-yl(meth)acrylate, or methyl 4,4-dimethyl-5-oxotetrahydrofuran-2-yl(meth)acrylate can be given.

As preferable examples of the other repeating units, a repeating unit of the following formula (4) (hereinafter called "repeating unit (4)") and a repeating unit of the following formula (5) (hereinafter called "repeating unit (5)") can be given.

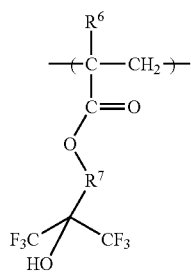

(4)

wherein $R^6$ represents a hydrogen atom, an alkyl group having 1 to 4 carbon atoms, a trifluoromethyl group, or a hydroxymethyl group, and $R^7$ represents a divalent organic group.

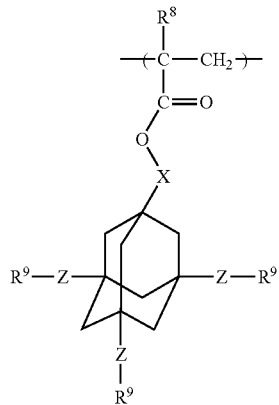

(5)

wherein $R^8$ represents a hydrogen atom or a methyl group, X represents a single bond or a divalent organic group having 1 to 3 carbon atoms, Z individually represent a single bond or a divalent organic group having 1 to 3 carbon atoms, and $R^9$ individually represent a hydrogen atom, a hydroxyl group, a cyano group, or a $COOR^{10}$ group.

As examples of the alkyl group having 1 to 4 carbon atoms represented by $R^6$ in the formula (4), a methyl group, an ethyl group, an n-propyl group, an i-propyl group, an n-butyl group, a 2-methylpropyl group, a 1-methylpropyl group, and a t-butyl group can be given.

The divalent organic group represented by $R^7$ in the formula (4) is preferably a divalent hydrocarbon group. Among divalent hydrocarbon groups, a chain-like or cyclic hydrocarbon group is preferable. This group may be an alkylene glycol group or an alkylene ester group.

As preferable examples of $R^7$, saturated chain-like hydrocarbon groups such as a methylene group, an ethylene group, a propylene group (e.g. 1,3-propylene group, 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; monocyclic hydrocarbon groups such as cycloalkylene groups having 3 to 10 carbon atoms such as cyclobutylene groups (e.g. a 1,3-cyclobutylene group), cyclopentylene groups (e.g. 1,3-cyclopentylene group), cyclohexylene groups (e.g. 1,4-cyclohexylene group), and cyclooctylene groups (e.g. 1,5-cyclooctylene group); bridged cyclic hydrocarbon groups such as cyclic hydrocarbon groups with 2 to 4 rings having 4 to 30 carbon atoms such as norbornylene groups (e.g. 1,4-norbornylene group, 2,5-norbornylene group), and admantylene groups (e.g. 1,5-admantylene group, 2,6-admantylene group); and the like can be given.

Particularly when the $R^7$ is a divalent alicyclic hydrocarbon group, it is preferable to insert an alkylene group having 1 to 4 carbon atoms as a spacer between the bis(trifluoromethyl)hydroxymethyl group and the alicyclic hydrocarbon group.

As $R^7$, a hydrocarbon group having a 2,5-norbornylene group, a 1,2-ethylene group, and a propylene group are preferable.

A methylene group, an ethylene group, and a propylene group can be given as a divalent organic group having 1 to 3 carbon atoms represented by X and Z in the formula (5).

$R^{10}$ in the $COOR^{10}$ group shown by $R^9$ in the formula (5) represents a hydrogen atom, a linear or branched alkyl group having 1 to 4 carbon atoms, or an alicyclic alkyl group having 3 to 20 carbon atoms. As examples of the linear or branched alkyl group having 1 to 4 carbon atoms represented by $R^{10}$, a methyl group, an ethyl group, an n-propyl group, an i-propyl group, an n-butyl group, a 2-methylpropyl group, a 1-methylpropyl group, and a t-butyl group can be given.

As examples of the alicyclic alkyl group having 3 to 20 carbon atoms, a cycloalkyl group shown by $-C_nH_{2n-1}$ (wherein n is an integer from 3 to 20) such as a cyclopropyl group, a cyclobutyl group, a cyclopentyl group, a cyclohexyl group, a cycloheptyl group, and a cyclooctyl group can be given. In addition, a polyalicyclic alkyl group such as a bicyclo[2.2.1]heptyl group, a tricyclo[5.2.1.0$^{2,6}$]decyl group, a tetracyclo[6.2.1.1$^{3,6}$.0$^{2,7}$]dodecanyl group, and adamantyl group, or a group in which a part of a cycloalkyl group or a polyalicyclic alkyl group is substituted with one or more linear, branched or cyclic alkyl group can be given as examples of the alicyclic alkyl group having 3 to 20 carbon atoms.

When at least one of three $R^9$ is not a hydrogen atom and X is a single bond, at least one of three Z is preferably a divalent organic group having 1 to 3 carbon atoms.

As preferable examples of the other repeating units, groups obtained by cleavage of polymerizable unsaturated double bond of a compound such as bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tetracyclo[6.2.1.1$^{3,6}$.0$^{2,7}$]dodec-9-yl(meth)acrylate, tricyclo[3.3.1.1$^{3,7}$]dec-1-yl(meth)acrylate, and tricyclo[3.3.1.1$^{3,7}$]dec-2-yl(meth)acrylate can be given.

Either one type or two or more types of these other repeating units may be included.

As specific examples of the resin (A), resins containing a combination of repeating units shown below can be given.

In the following repeating units, $R^{11}$ individually represent a hydrogen atom or a methyl group.

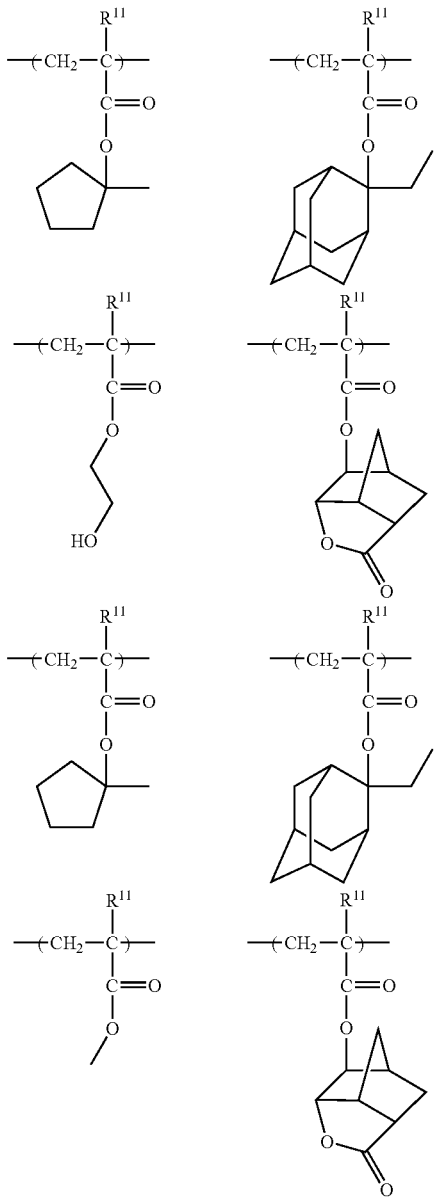

The content of the repeating unit (1) in the resin (A) is usually 5 to 30 mol %, preferably 5 to 20 mol %, and more preferably 10 to 20 mol % for 100 mol % of all repeating units in the resin (A). If the content of the repeating unit (1) is less than 5 mol %, solubility of the resist in a solvent, adhesion to a substrate, or roundness and CD uniformity may be insufficient. If the content is more than 30 mol %, on the other hand, the resist pattern shape and resolution may decrease.

The content of the repeating unit (2) is usually 5 to 70 mol %, preferably 5 to 50 mol %, and more preferably 10 to 50 mol % for 100 mol % of all repeating units in the resin (A). If the content of the repeating unit (2) is less than 5 mol %, resolution may be insufficient. When the content is more than 70 mol %, on the other hand, sufficient roundness, CD uniformity, and pattern shape may not be obtained.

The content of the other repeating units is preferably 5 to 70 mol %, more preferably 10 to 70 mol %, and still more preferably 20 to 60 mol % for 100 mol % of all repeating units in the resin (A). The content of the other repeating units of 5 to 70 mol % is preferable from the viewpoint of resolution and the like.

The polystyrene-reduced weight average molecular weight (hereinafter abbreviated as "Mw") of the resin (A) measured by gel permeation chromatography (GPC) is usually 1000 to 300,000, preferably 2000 to 200,000, and more preferably 3000 to 100,000. If the Mw is less than 1000, heat resistance of the resist may decrease. On the other hand, if more than 300,000, developability as a resist may be impaired.

The ratio of the Mw to the polystyrene-reduced number average molecular weight (hereinafter referred to as "Mn") (Mw/Mn) of the resin (A) is usually 1 to 5, and preferably 1 to 3.

The radiation-sensitive resin composition of the embodiment of the present invention may contain only one type of the resin (A) or two or more types of the resin (A).

The resin (A) is prepared by polymerizing a mixture of monomers corresponding to each of the above repeating units in an appropriate solvent in the presence of a chain transfer agent, as required, using a radical polymerization initiator such as a hydroperoxide, a dialkyl peroxide, a diacyl peroxide, or an azo compound.

As examples of the solvent which can be used for the polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethanes; alkylketones such as 2-butanone, 2-heptanone, and methyl isobutyl ketone; cycloalkylketones such as cyclohexanone; alcohols such as 2-propanol and propylene glycol monomethyl ether; and the like can be given. These solvents may be used either individually, or in a combination of two or more.

The polymerization reaction temperature is usually 40 to 120° C., and preferably 50 to 100° C. The polymerization time is usually 1 to 48 hours, and preferably 1 to 24 hours.

It is preferable that the resin (A) have a high purity and does not contain impurities such as halogens or metals. In addition, the content of residual monomers and oligomers is preferably less than a prescribed amount, for example, such a content determined by HPLC is preferably not more than 0.1 mass %. Satisfying these requirements not only improves sensitivity, resolution, process stability, and pattern shape of the resist, but ensures a resist with no change in the foreign matter content and sensitivity over time.

As examples of a purification method for the resin (A), the following methods can be given.

As a method for removing impurities such as metals, a method of causing metals in the resin solution to be adsorbed using a zeta-potential filter, a method of causing metals to be in a chelate state by washing the resin solution with an acidic aqueous solution such as an oxalic acid solution or a sulfonic acid solution and removing the metals, and the like can be given.

As a method for removing residual monomers and oligomer components to a concentration of not more than a specific level, a liquid-liquid extraction method in which the residual monomers and oligomer components are removed by combining washing with water and a suitable solvent, a purification method in a solution state such as ultrafiltration in which only the components having a molecular weight of not more than a specific value are extracted and removed, a reprecipitation method in which the residual monomers and the like are removed by adding the resin solution to a poor solvent dropwise, thereby causing the resin solution to coagulate in the poor solvent, a purification method in a solid state in which the resin slurry separated by filtration is washed with a poor solvent, and the like can be given. These methods may be used in combination.

The poor solvent used in the reprecipitation method is appropriately selected according to the properties and the like of the resin to be purified.

[2] Radiation-Sensitive Acid Generator

The radiation-sensitive acid generator of the embodiment of the present invention is a material which generates an acid upon exposure (hereinafter referred to from time to time as "acid generator (B)").

Although a general material can be used, the acid generator (B) preferably includes a compound shown by the following formula (6).

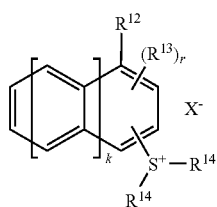

(6)

wherein $R^{12}$ represents a hydrogen atom, a fluorine atom, a hydroxyl group, a linear, branched, or cyclic alkyl group having 1 to 10 carbon atoms, a linear or branched alkoxyl group having 1 to 10 carbon atoms, or a linear or branched alkoxycarbonyl group having 2 to 11 carbon atoms, $R^{13}$ represents a linear or branched alkyl group having 1 to 10 carbon atoms, a linear or branched alkoxyl group having 1 to 10 carbon atoms, or a linear, branched, or cyclic alkanesulfonyl group having 1 to 10 carbon atoms, $R^{14}$ individually represent a linear or branched alkyl group having 1 to 10 carbon atoms, a substituted or unsubstituted phenyl group, or a substituted or unsubstituted naphthyl group, or two $R^{14}$ groups bond to form a substituted or unsubstituted divalent group having 2 to 10 carbon atoms, k is an integer from 0 to 2, $X^-$ represents an anion represented by the formula $R^{15}C_nF_{2n}SO_3^-$ or $R^{15}SO_3^-$ (wherein $R^{15}$ represents a fluorine atom or a substituted or unsubstituted hydrocarbon group having 1 to 12 carbon atoms, and n is an integer from 1 to 10), or an anion represented by the following formula (7-1) or (7-2), and r is an integer from 1 to 10;

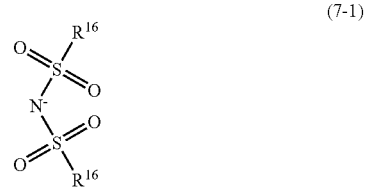

(7-1)

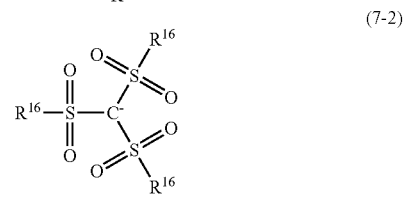

(7-2)

wherein $R^{16}$ individually represent a linear or branched fluorine atom-containing alkyl group having 1 to 10 carbon atoms, or two $R^{16}$ groups in combination represent a fluorine atom-containing divalent organic group having 2 to 10 carbon atoms, wherein the divalent organic group may have a substituent.

In the formula (6), as examples of the linear or the branched alkyl group having 1 to 10 carbon atoms represented by $R^{12}$, $R^{13}$, and $R^{14}$, a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like can be given. Of these alkyl groups, a methyl group, an ethyl group, an n-butyl group, a t-butyl group, and the like are preferable.

As examples of the cycloalkyl group represented by $R^{12}$, a cyclopentyl group and a cyclohexyl group can be given.

Examples of the linear or branched alkoxyl group having 1 to 10 carbon atoms represented by $R^{12}$ and $R^{13}$ include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, and an n-decyloxy group. Of these, a methoxy group, an ethoxy group, an n-propoxy group, a n-butoxy group, and the like are preferable.

Examples of the linear or branched alkoxycarbonyl group having 2 to 11 carbon atoms represented by $R^{12}$ include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, an neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, and an n-decyloxycarbonyl group. Of these alkoxycarbonyl groups, a methoxycarbonyl group, an ethoxycarbonyl group, and an n-butoxycarbonyl group are preferable.

As examples of the linear, branched, or cyclic alkanesulfonyl group having 1 to 10 carbon atoms represented by $R^{13}$, a methanesulfonyl group, an ethanesulfonyl group, an n-propanesulfonyl group, an n-buthanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, and a cyclohexanesulfonyl group can be given. Of these alkanesulfonyl groups, a methanesulfonyl group, an ethanesulfonyl group, an n-propanesulfonyl group, an n-butanesulfonyl group, a cyclopentanesulfonyl group, and a cyclohexanesulfonyl group are preferable.

r is preferably 0 to 2.

Examples of the substituted or unsubstituted phenyl group represented by $R^{14}$ in the formula (6) include a phenyl group; phenyl groups substituted with a linear, branched, or cyclic alkyl group having 1 to 10 carbon atoms such as an o-tolyl group, an m-tolyl group, a p-tolyl group, a 2,3-dimethylphenyl group, a 2,4-dimethylphenyl group, a 2,5-dimethylphenyl group, a 2,6-dimethylphenyl group, a 3,4-dimethylphenyl group, a 3,5-dimethylphenyl group, a 2,4,6-trimethylphenyl group, a 4-ethylphenyl group, a 4-t-butylphenyl group, a 4-cyclohexylphenyl group, and a 4-fluorophenyl group; and groups obtained by substituting the phenyl group or alkyl-substituted phenyl groups with one or more groups such as a hydroxyl group, a carboxyl group, a cyano group, a nitro group, an alkoxyl group, an alkoxyalkyl group, an alkoxycarbonyl group, and an alkoxycarbonyloxy group.

Examples of the alkoxyl group as the substituent for the phenyl group or alkyl-substituted phenyl group include linear, branched, or cyclic alkoxyl groups having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include linear, branched, or cyclic alkoxyalkyl groups having 2 to 21 carbon atoms such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include linear, branched, or cyclic alkoxycarbonyl groups having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the alkoxycarbonyloxy group include linear, branched, or cyclic alkoxycarbonyloxy groups having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group.

Preferable phenyl groups which may have a substituent represented by $R^{13}$ in the formula (6) include a phenyl group, a 4-cyclohexylphenyl group, a 4-t-butylphenyl group, a 4-methoxyphenyl group, a 4-t-butoxyphenyl group, and the like.

Examples of the substituted or unsubstituted naphthyl group for $R^{14}$ include naphthyl groups substituted or unsubstituted with a linear, branched, or cyclic alkyl group having 1-10 carbon atoms such as a naphthyl group, a 1-naphthyl group, a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, a 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group; and groups obtained by further substituting one or more hydrogen atoms in the naphthyl group or alkyl-substituted naphthyl group with a hydroxyl group, a carboxyl group, a cyano group, a nitro group, an alkoxyl group, an alkoxyalkyl group, an alkoxycarbonyl group, or an alkoxycarbonyloxy group.

As examples of the alkoxyl group, alkoxyalkyl group, alkoxycarbonyl group, and alkoxycarbonyloxy group which are the substituents, the groups illustrated for the phenyl group and the alkyl-substituted phenyl groups can be given.

As the naphtyl group which may have a substituent $R^{14}$ in the formula (6), a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphtyl) group, a 2-(7-n-butoxynaphthyl) group, and the like are preferable.

As an example of the divalent group having 2 to 10 carbon atoms formed by two $R^{14}$ groups, a group forming a 5 or 6 member ring together with the sulfur atom in the formula (6), particularly preferably a 5 member ring (i.e. tetrahydrothiophene ring) is preferable.

As examples of the substituent for the above divalent groups, the groups previously mentioned for the phenyl group and alkyl-substituted phenyl groups, such as a hydroxyl group, a carboxyl group, a cyano group, a nitro group, an alkoxyl group, an alkoxyalkyl group, an alkoxycarbonyl group, and an alkoxycarbonyloxy group can be given.

As the group $R^{14}$ in the formula (6), a methyl group, an ethyl group, a phenyl group, a 4-methoxyphenyl group, and a 1-naphthyl group, and a divalent group having a tetrahydrothiophene cyclic structure formed by two $R^{14}$ groups together with the sulfur atom, and the like are preferable.

$X^-$ in the formula (6) is an anion shown by $R^{15}C_nF_{2n}SO_3^-$, $R^{15}SO_3^-$, or the above formulas (7-1) or (7-2). When $X^-$ is $R^{15}C_nF_{2n}SO_3^-$, the —$C_nF_{2n}$— group is a perfluoroalkylene group having carbon atoms of the number n. This group is either linear or branched. n is preferably 1, 2, 4, or 8.

As a hydrocarbon group having 1 to 12 carbon atoms which may have a substituent represented by $R^{15}$, an alkyl group having 1 to 12 carbon atoms, a cycloalkyl group, and a bridged alicyclic hydrocarbon group are preferable.

As specific examples, a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, and an adamantyl group can be given.

When $X^-$ is an anion shown by the formula (7-1) or (7-2), $R^{16}$ individually may represent a linear or branched fluorine atom-containing alkyl group having 1 to 10 carbon atoms, or two $R^{16}$ groups in combination may represent a fluorine atom-containing divalent organic group having 2 to 10 carbon atoms, wherein the divalent organic group may have a substituent.

A trifluoromethyl group, a pentafluoroethyl group, a heptafluoropropyl group, a nonafluorobutyl group, a dodecafluoropentyl group, a perfluorooctyl group, and the like can be given as examples of $R^{16}$ when the $R^{16}$ in the formula (7-1) or (7-2) is a linear or branched alkyl group having 1 to 10 carbon atoms.

A tetrafluoroethylene group, a hexafluoropropylene group, an octafluorobutylene group, a decafluoropentylene group, an undecafluorohexylene group, and the like can be given as examples of $R^{16}$ when the $R^{16}$ is a divalent organic group having 2 to 10 carbon atoms.

As specific examples of the acid generator (B), triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[4.4.0.1$^{2,5}$.1$^{7,10}$]dodecanyl)-1,1-difluoroethanesulfonate, triphenylsulfonium N,N-bis(nonafluoro-n-butanesulfonyl)imidate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-(3-tetracyclo[4.4.0.1$^{2,5}$.1$^{7,10}$-]dodecanyl)-1,1-difluoroethanesulfonate, 4-cyclohexylphenyldiphenylsulfonium N,N-bis(nonafluoro-n-butanesulfonyl)imidate, 4-cyclohexylphenyldiphenylsulfonium camphorsulfonate, 4-t-butylphenyldiphenylsulfonium trifluoromethanesulfonate, 4-t-butylphenyldiphenylsulfonium nonafluoro-n-butanesulfonate, 4-t-butylphenyldiphenylsulfonium perfluoro-n-octanesulfonate, 4-t-butylphenyldiphenylsulfonium 2-bicyclo[2.2.1]hept-2-yl-1,1,2,2-tetrafluoroethanesulfonate, 4-t-butylphenyldiphenylsulfonium 2-(3-tetracyclo[4.4.0.1$^{2,5}$.1$^{7,10}$]dodecanyl)-1,1-difluoroethanesulfonate, 4-t-butylphenyldiphenylsulfonium N,N-bis(nonafluoro-n-butanesulfonyl)imidate, 4-t-butylphenyldiphenylsulfonium camphorsulfonate, tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium 2-bicyclo[2.2.1]hept-2-yl-1,1,2,2-tetrafluoroethanesulfonate, tri(4-t-butylphenyl)sulfonium 2-(3-tetracyclo[4.4.0.1$^{2,5}$.1$^{7,10}$]dodecanyl)-1,1-difluoroethanesulfonate, tri(4-t-butylphenyl)sulfonium N,N-bis(nonafluoro-n-butanesulfonyl)imidate, tri(4-t-butylphenyl)sulfonium camphorsulfonate, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium 2-(3-tetracyclo[4.4.0.1$^{2,5}$.1$^{7,10}$]dodecanyl)-1,1-difluoroethanesulfonate, diphenyliodonium N,N-bis(nonafluoro-n-butanesulfonyl)imidate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium 2-(3-tetracyclo[4.4.0.1$^{2,5}$.1$^{7,10}$]dodecanyl)-1,1-difluoroethanesulfonate, bis(4-t-butylphenyl)iodonium N,N-bis(nonafluoro-n-butanesulfonyl)imidate, bis(4-t-butylphenyl)iodonium camphorsulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium 2-(3-tetracyclo[4.4.0.1$^{2,5}$.1$^{7,10}$]dodecanyl)-1,1-difluoroethanesulfonate, 1-(4-n-butoxynaphthalen-1-yl)tetrahydrothiophenium N,N-bis(nonafluoro-n-butanesulfonyl)imidate, 1-(4-n-butoxynaphthalen-1-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium 2-(3-tetracyclo[4.4.0.1$^{2,5}$.1$^{7,10}$]dodecanyl)-1,1-difluoroethanesulfonate, 1-(3,5-dimethyl-4-hydroxyphenyl)tetrahydrothiophenium N,N-bis(nonafluoro-n-butanesulfonyl)imidate, 1-(3,5-dimethyl-4-hydroxyphenyl)tetrahydrothiophenium camphorsulfonate, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)-succinimide, N-(camphorsulfonyloxy)succinimide, N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]-hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicycle-[2.2.1]hept-5-ene-2,3-dicarboxylmide, and N-(camphorsulfonyloxy)bicyclo[2.2.1]hept-5-ene-2,3-dicarboxylmide are preferably used.

Among these, acid generators of the formula (6) in which the two $R^{14}$ groups bond together to form a divalent group having 2 to 10 carbon atoms such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium 2-(3-tetracyclo[4.4.0.1$^{2,5}$.1$^{7,10}$]dodecanyl)-1,1-difluoroethanesulfonate, 1-(4-n-butoxynaphthalen-1-yl)tetrahydrothiophenium N,N-bis(nonafluoro-n-butanesulfonyl)imidate, and 1-(4-n-butoxynaphthalen-1-yl)tetrahydrothiophenium camphorsulfonate are preferable.

Particularly preferable compounds are 1-(4-n-butoxynaphthalen-1-yl)tetrahydrothiophenium 2-bicyclo[2.2.1]hept-2-yl-1,1,2,2-tetrafluoroethanesulfonate and 1-(4-n-butoxynaphthalen-1-yl)tetrahydrothiophenium 2-(3-tetracyclo[4.4.0.1$^{2,5}$.1$^{7,10}$]dodecanyl)-1,1-difluoroethanesulfonate.

These acid generators (B) may be used either individually, or in a combination of two or more.

The amount of the acid generators to be used is usually 0.1 to 20 parts by mass, and preferably 0.1 to 10 parts by mass for 100 parts by mass of the resin (A) from the viewpoint of ensuring sensitivity and developability as a resist. If this amount is less than 0.1 part by mass, the sensitivity and developability may be impaired. On the other hand, if the amount is more than 20 parts by mass, the radiation transmittance of the composition may decrease so that a rectangular resist pattern may not be obtained.

[3] Solvents

The radiation-sensitive resin composition of the embodiment of the present invention is usually used in the form of a composition solution prepared by dissolving the composition in a solvent (hereinafter referred to from time to time as "solvent (C)") so that the total solid content is usually 1 to 50 mass %, and preferably 1 to 25 mass %, and filtering the solution using a filter with a pore diameter of about 0.2 μm, for example.

Examples of the solvent (C) include, in addition to linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-1-propyl ether acetate, propylene glycol mono-n-butyl ether acetate, propylene glycol mono-1-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; and alkyl 3-alkoxypropionates such as methyl 3-methoxypropionate, ethyl 3-methoxypropionate, methyl 3-ethoxypropionate, and ethyl 3-ethoxypropionate;

as well as the above other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate.

Among these, linear or branched ketones, cyclic ketones, propylene glycol monoalkyl ether acetates, alkyl 2-hydroxypropionates, alkyl 3-alkoxypropionates, γ-butyrolactone, and the like are preferable.

These solvents (C) may be used either individually, or in a combination of two or more.

[4] Additives

To the extent not impairing the effect of the embodiment of the present invention, the radiation-sensitive resin composition of the embodiment of the present invention may optionally contain various kinds of additives such as an acid diffusion controller, an alicyclic additive, a surfactant, a photosensitizer, and the like.

<Acid Diffusion Controller>

The acid diffusion controllers control diffusion of an acid generated from the acid generator upon exposure in the resist film and suppress undesired chemical reactions in the unexposed area.

The storage stability of the radiation-sensitive resin composition can be improved by adding the acid diffusion controller. Moreover, the addition of the acid diffusion controller further improves the resolution of the resist, and suppresses a change in line width of the resist pattern due to a variation in post-exposure delay (PED) from exposure to post-exposure heat treatment so that a composition that exhibits excellent process stability can be obtained.

As examples of the acid diffusion controller, nitrogen-containing compounds such as tertiary amine compounds, amide group-containing compounds, quaternary ammonium hydroxide compounds, and nitrogen-containing heterocyclic compounds can be given.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline, alkanolamines such as triethanolamine and N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzene tetramethylenediamine, bis(2-dimethylaminoethyl) ether, bis(2-diethylaminoethyl)ether, and the like.

As examples of the amide group-containing compounds, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminonooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole; and the like can be given.

As examples of the quaternary ammonium hydroxide compound, tetra-n-propylammonium hydroxide and tetra-n-butylammonium hydroxide can be given.

Examples of the nitrogen-containing heterocyclic compound include pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, 1,4-diazabicyclo[2.2.2]octane, imidazole, 4-methylimidazole, 1-benzyl-2-methylimidazole, 4-methyl-2-phenylimidazole, benzimidazole, 2-phenylbenzimidazole, N-t-butoxycarbonylbenzimidazole, N-t-butoxycarbonyl-2-methylbenzimidazole, and N-t-butoxycarbonyl-2-phenylbenzimidazole.

These nitrogen-containing compounds may be used either individually, or in a combination of two or more.

The amount of the acid diffusion controller used in the embodiment of the present invention is usually 10 parts by mass or less, and preferably 5 parts by mass or less for 100 parts by mass of the resin (A) from the viewpoint of ensuring high sensitivity as a resist. If this amount is more than 10 parts by mass, the sensitivity of the resist may be unduly impaired. If the amount is less than 0.001 part by mass, the pattern shape or dimensional accuracy as a resist may decrease depending on the processing conditions.

<Alicyclic Additives>

The alicyclic additives further improve dry etching tolerance, pattern shape, and adhesion to substrate.

As examples of the alicyclic additives, adamantane derivatives such as 1-adamantane carboxylate, 2-adamantanon, t-butyl-1-adamantane carboxylate, t-butoxycarbonylmethyl-1-adamantane carboxylate, α-butyrolactone-1-adamantane carboxylate, di-t-butyl-1,3-adamantanedicarboxylate, t-butyl-1-adamantane acetate, t-butoxycarbonylmethyl-1-adamantane acetate, di-t-butyl-1,3-adamantane diacetate, and 2,5-dimethyl-2,5-di(adamantylcarbonyloxy)hexane; alkyl carboxylic acid esters such as dimethyl adipate, diethyl adipate, dipropyl adipate, di-n-butyl adipate, and di-t-butyl adipate; and 5-[2-hydroxy-2,2-bis(trifluoromethyl)ethyl]tetracyclo[6.2.1.1$^{3,6}$.0$^{2,7}$]dodecane can be given. As other compounds, t-butoxycarbonylmethyl deoxycholate, t-butoxycarbonylmethyl lithocholate, and the like can be given.

These alicyclic additives may be used either individually, or in a combination of two or more.

<Surfactants>

The surfactant improves applicability, striation, developability, and the like of the radiation-sensitive resin composition.

As the surfactants, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by Dainippon Ink and Chemicals, Inc.), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like can be given.

These surfactants may be used either individually, or in a combination of two or more.

<Sensitizer>

The sensitizers absorb radiation energy and transmit the energy to the acid generator (B), thereby increasing the amount of acid generated upon exposure. The sensitizers improve apparent sensitivity of the radiation-sensitive resin composition.

As examples of the sensitizer, carbazoles, acetophenones, benzophenones, naphthalenes, phenols, biacetyl, eosin, rose bengal, pyrenes, anthracenes, phenothiazines, and the like can be given.

These sensitizers may be used either individually, or in a combination of two or more.

In addition to the above additives, an alkali-soluble resin, a low molecular weight alkali solubility controller containing an acid labile protecting group, a halation inhibitor, a preservation stabilizer, an antifoaming agent, and the like may be added to the radiation-sensitive resin composition of the embodiment of the present invention. Addition of a dye or a pigment visualizes a latent image in the exposed area, thereby decreasing the effects of halation during exposure. Use of an adhesion improver improves adhesion to the substrate.

[5] Resist Pattern Forming Method

The radiation-sensitive resin composition of the embodiment of the present invention is useful as a chemically-amplified resist, particularly for forming a contact hole pattern. In the chemically-amplified resist, an acid labile group in the resin components, mainly resin (A), dissociates by the action of an acid generated from the acid generator upon exposure, thereby producing a carboxyl group. As a result, solubility of the exposed part of the resist in an alkaline developer increases, whereby the exposed part is dissolved in an alkaline developer and removed to obtain a positive-tone resist pattern.

A resist pattern is formed from the radiation-sensitive resin composition of the embodiment of the present invention by applying the resin composition solution to, for example, substrates such as a silicon wafer or a wafer coated with aluminum using an appropriate application method such as rotational coating, cast coating, and roll coating to form a resist film. The resist film is then optionally pre-baked (hereinafter called "PB") and exposed to radiation to form a prescribed resist pattern. As radiation used for exposure, visible rays, ultraviolet rays, deep ultraviolet rays, X-rays, electron beams, or the like are appropriately selected depending on the type of acid generator. It is particularly preferable to use an ArF excimer laser (wavelength: 193 nm) or KrF excimer laser (wavelength: 248 nm). An ArF excimer laser (wavelength: 193 nm) is particularly preferable.

The exposure conditions such as the light exposure are appropriately determined depending on the composition of the radiation-sensitive resin composition, types of additives, and the like. When using the radiation-sensitive resin composition of the embodiment of the present invention, it is preferable to perform a post-exposure bake (PEB) after exposure. The PEB ensures a smooth dissociation reaction of the acid labile group contained in the resin components. The heating temperature for the PEB is usually 30 to 200° C., and preferably 50 to 170° C., although the heating conditions are changed according to the formulation of the radiation-sensitive resin composition.

In order to bring out the potential of the radiation-sensitive resin composition to the maximum extent when forming a resist pattern, an organic or inorganic antireflection film may be formed on the substrate as disclosed in Japanese Examined Patent Publication (KOKOKU) No. 6-12452 (Japanese Patent Application Publication (KOKAI) No. 59-93448), for example. In addition, a protective film may be provided on the resist film in order to prevent an adverse effect of basic impurities and the like that are present in the environmental atmosphere using a method described in, for example, Japanese Patent Application Publication (KOKAI) No. 5-188598. Moreover, in order to prevent the acid generator and the like from flowing out of the resist film during liquid immersion lithography, a protective film for liquid immersion lithography may be provided on the resist film as disclosed in, for example, Japanese Patent Application Publication (KOKAI) No. 2005-352384. These techniques may be used in combination.

The exposed resist film is then developed to form a prescribed resist pattern. As examples of the developer used for development, alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene are preferable.

The concentration of the alkaline aqueous solution is usually 10 mass % or less. If the concentration of the alkaline aqueous solution exceeds 10 mass %, an unexposed part may be dissolved in the developer.

Organic solvents may be added to the developer containing the alkaline aqueous solution.

As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually, or in a combination of two or more.

The amount of the organic solvent to be used is preferably 100 vol % or less of the alkaline aqueous solution. If the amount of the organic solvent is more than 100 vol %, the developability may decrease so that the exposed area may remain undeveloped.

In addition, an appropriate amount of a surfactant and the like may be added to the developer containing the alkaline aqueous solution.

After development using the alkaline aqueous solution developer, the resist film is generally washed with water and dried.

EXAMPLES

The embodiments of the present invention are further described below by way of examples. However, these examples should not be construed as limiting the present invention. In the Examples, "part" and "%" respectively refer to "part by mass" and "mass %", unless otherwise indicated.

[1] Synthesis of Resin (A)

Synthesis Example 1

34.675 g (40 mol %) of the following compound (M-1), 6.700 g (10 mol %) of the following compound (M-2), and 45.83 g (40 mol %) of the following compound (M-3) were dissolved in 200 g of 2-butanone, and 4.23 g of azobisisobutyronitrile was then added to prepare a monomer solution. A 1000 ml three-necked flask charged with 12.80 g (10 mol %) of the following compound (M-4) and 100 g of 2-butanone was purged with nitrogen gas for 30 minutes. After the nitrogen purge, the mixture was stirred while heating the reaction vessel at 80° C., and the previously-prepared monomer solution mentioned above was added dropwise using a dropping funnel over three hours. The polymerization reaction was carried out for six hours after starting addition of the monomer solution. After completion of polymerization, the polymer solution was cooled with water to 30° C. or lower and poured into 2000 g of methanol. A white precipitate produced was collected by filtration. The white powder collected by filtration was washed twice with 800 g of methanol in a slurry state, filtered again, and dried for 17 hours at 50° C. to obtain a copolymer in the form of a white powder (66 g, yield 66%).

The copolymer had a molecular weight (Mw) of 6800, Mw/Mn of 1.35, and the ratio of the repeating units of the compound (M-1), the compound (M-2), the compound (M-3), and the compound (M-4) determined by $^{13}$C-NMR analysis was 39.5:10.0:41.3:9.2 (mol %). This copolymer is referred to as a resin (A-1).

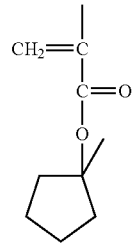

(M-1)

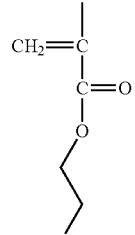

(M-2)

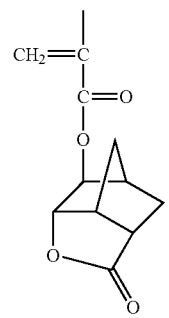

(M-3)

(M-4)

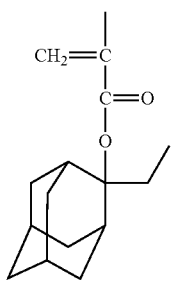

Synthesis Example 2

35.22 g (40 mol %) of the following compound (M-1), 5.24 g (10 mol %) of the following compound (M-5), and 46.53 g (40 mol %) of the following compound (M-3) were dissolved in 200 g of 2-butanone, and 4.30 g of azobisisobutyronitrile was then added to prepare a monomer solution. A 1000 ml three-necked flask charged with 13.02 g (10 mol %) of the following compound (M-4) and 100 g of 2-butanone was purged with nitrogen gas for 30 minutes. After the nitrogen purge, the mixture was stirred while heating the reaction vessel at 80° C., and the previously-prepared monomer solution mentioned above was added dropwise using a dropping funnel over three hours. The polymerization reaction was carried out for six hours after starting addition of the monomer solution. After completion of polymerization, the polymer solution was cooled with water to 30° C. or lower and poured into 2000 g of methanol. A white precipitate produced was collected by filtration. The filtered white powder was washed twice with 400 g of methanol in the form of slurry, filtered, and dried at 50° C. for 17 hours to obtain a copolymer in the form of a white powder (72 g, yield of 72%).

The copolymer had a molecular weight (Mw) of 6800, Mw/Mn of 1.40, and the ratio of the repeating units of the compound (M-1), the compound (M-5), the compound (M-3), and the compound (M-4) determined by $^{13}$C-NMR analysis was 40.2:8.0:41.9:9.9 (mol %). This copolymer is referred to as a resin (A-2).

(M-1)

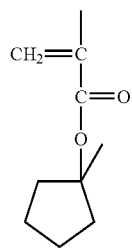

(M-5)

(M-3)

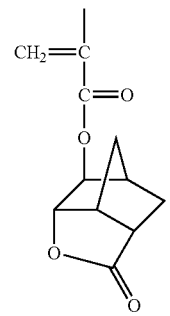

(M-4)

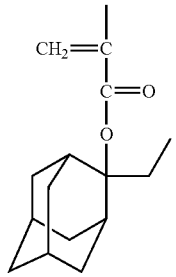

Synthesis Example 3

28.40 g (35 mol %) of the following compound (M-1) and 53.62 g (50 mol %) of the following compound (M-3) were dissolved in 200 g of 2-butanone, and 3.96 g of azobisisobutyronitrile was then added to prepare a monomer solution. A 1000 ml three-necked flask charged with 17.98 g (15 mol %) of the following compound (M-4) and 100 g of 2-butanone was purged with nitrogen gas for 30 minutes. After the nitrogen purge, the mixture was stirred while heating the reaction vessel at 80° C., and the previously-prepared monomer solution mentioned above was added dropwise using a dropping funnel over three hours. The polymerization reaction was carried out for six hours after starting addition of the monomer solution. After completion of polymerization, the polymer solution was cooled with water to 30° C. or lower and poured into 2000 g of methanol. A white precipitate produced was collected by filtration. The filtered white powder was washed twice with 400 g of methanol in the form of slurry, filtered, and dried at 50° C. for 17 hours to obtain a copolymer in the form of a white powder (77 g, yield of 77%).

The copolymer had a molecular weight (Mw) of 5900, Mw/Mn of 1.42, and the ratio of the repeating units of the compound (M-1), the compound (M-3), and the compound (M-4) determined by $^{13}$C-NMR analysis was 33.2:52.5:14.3 (mol %). This copolymer is referred to as a resin (A-3).

(M-1)

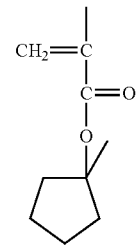

-continued

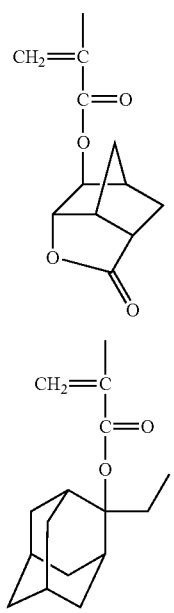

(M-3)

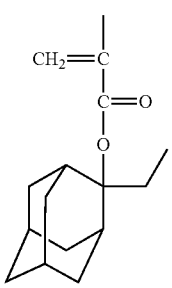

(M-4)

Synthesis Example 4

55.83 g (50 mol %) of the following compound (M-6), 12.40 g (20 mol %) of the following compound (M-2), and 31.78 g (30 mol %) of the following compound (M-3) were dissolved in 200 g of 2-butanone, and 3.90 g of azobisisobutyronitrile was then added to prepare a monomer solution. A 1000 ml three-necked flask charged with 100 g of 2-butanone was purged with nitrogen gas for 30 minutes. After the nitrogen purge, the reaction vessel was heated to 80° C. while stirring, and the previously-prepared monomer solution mentioned above was added dropwise using a dropping funnel over three hours. The polymerization reaction was carried out for six hours after starting addition of the monomer solution. After completion of polymerization, the polymer solution was cooled with water to 30° C. or lower and poured into 2000 g of methanol. A white precipitate produced was collected by filtration. The white powder collected by filtration was washed twice with 400 g of methanol in a slurry state, filtered again, and dried for 17 hours at 50° C. to obtain a copolymer in the form of a white powder (84 g, yield 84%).

The copolymer had a molecular weight (Mw) of 4300, Mw/Mn of 1.24, and the ratio of the repeating units of the compound (M-6), the compound (M-2), and the compound (M-3) determined by $^{13}$C-NMR analysis was 50.5:18.4:31.1 (mol %). The copolymer is referred to as a resin (A-4).

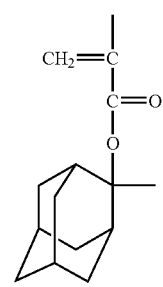

(M-6)

-continued

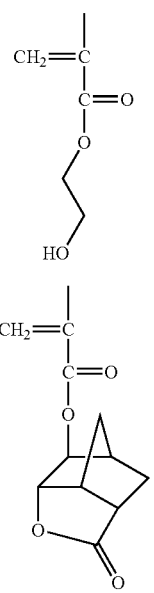

(M-2)

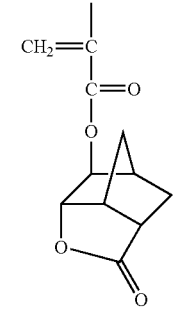

(M-3)

Synthesis Example 5

45.22 g (50 mol %) of the following compound (M-1), 7.00 g (10 mol %) of the following compound (M-2), and 47.79 g (40 mol %) of the following compound (M-3) were dissolved in 200 g of 2-butanone, and 4.41 g of azobisisobutyronitrile was then added to prepare a monomer solution. A 1000 ml three-necked flask charged with 100 g of 2-butanone was purged with nitrogen gas for 30 minutes. After the nitrogen purge, the reaction vessel was heated to 80° C. while stirring, and the previously-prepared monomer solution mentioned above was added dropwise using a dropping funnel over three hours. The polymerization reaction was carried out for six hours after starting addition of the monomer solution. After completion of polymerization, the polymer solution was cooled with water to 30° C. or lower and poured into 2000 g of hexane. A white precipitate produced was collected by filtration. The filtered white powder was washed twice with 800 g of hexane in the form of slurry, filtered, and dried at 50° C. for 17 hours to obtain a copolymer in the form of a white powder (72.0 g, yield of 72%).

The copolymer had a molecular weight (Mw) of 6764, Mw/Mn of 1.55, and the ratio of the repeating units of the compound (M-1), the compound (M-2), and the compound (M-3) determined by $^{13}$C-NMR analysis was 49.5:10.0:40.5 (mol %). This copolymer is referred to as a resin (A-5).

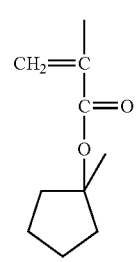

(M-1)

-continued

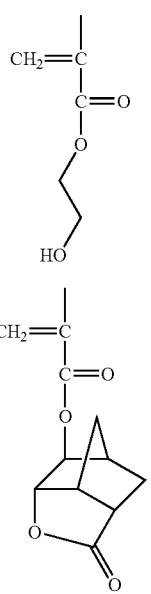

Measurement and evaluation in the above Synthesis Examples were carried out according to the following procedures.

<Mw and Mn>

Mw was measured by gel permeation chromatography (GPC) using GPC columns (manufactured by Tosoh Corp., G2000H$^{XZ}$x2, G3000H$^{XZ}$x1, G4000H$^{XZ}$x1) under the following conditions. Flow rate: 1.0 ml/minute, eluate: tetrahydrofuran, column temperature: 40° C., standard reference material: monodispersed polystyrene. The dispersibility (Mw/Mn) was calculated from the measurement results.

<$^{13}$C-NMR Analysis>

$^{13}$C-NMR analysis of each polymer was carried out using "JNM-EX270" (manufactured by JEOL Ltd.).

[2] Preparation of Radiation-Sensitive Resin Composition Solution

The resin (A), acid generator (B), and acid diffusion controller (D) shown in Table 1 were dissolved in the solvent (C) in the proportion shown in Table 1. The mixed solution was filtered through a membrane filter with a pore diameter of 0.2 μm to prepare radiation-sensitive resin composition solutions of Examples 1 to 3 and Comparative Examples 1 and 2.

TABLE 1

| | Resin (A) (type/part) | Acid generator (B) (type/part) | Acid diffusion controller (D) (type/part) | Solvent (C) (type/part) |
|---|---|---|---|---|
| Example 1 | A-1/100 | B-1/4<br>B-2/5 | D-1/0.94 | C-1/1300<br>C-2/557<br>C-3/30 |
| Example 2 | A-2/100 | B-1/4<br>B-2/5 | D-1/0.94 | C-1/1300<br>C-2/557<br>C-3/30 |
| Example 3 | A-5/100 | B-1/4<br>B-2/5 | D-1/0.94 | C-1/1300<br>C-2/557<br>C-3/30 |
| Comparative Example 1 | A-3/100 | B-1/4<br>B-2/5 | D-1/0.94 | C-1/1300<br>C-2/557<br>C-3/30 |
| Comparative Example 2 | A-4/100 | B-1/4<br>B-2/5 | D-1/0.94 | C-1/1300<br>C-2/557<br>C-3/30 |

The acid generators (B), the solvents (C), and the acid diffusion controller (D) in Table 1 are as follows.

<Acid Generator (B)>

B-1: 4-cyclohexylphenyldiphenylsulfonium nonafluoro-n-butanesulfonate

B-2: 1-(4-n-butoxynaphthyl)tetrahydrothiophenium 2-(bicyclo[2.2.1]hept-2'-yl)-1,1,2,2-tetrafluoroethanesulfonate <Solvent (C)>

C-1: propylene glycol monomethyl ether acetate

C-2: cyclohexanone

C-3: γ-butyrolactone

<Acid diffusion controller (D)>

D-1: N-t-butoxycarbonyl-4-hydroxypiperidine

[3] Performance Evaluation of Radiation-sensitive Resin Composition

The performance of the radiation-sensitive resin composition solutions of Examples 1 to 3 and Comparative Examples 1 to 2 was evaluated by the following method. The evaluation results are shown in Table 3.

<Sensitivity>

Each composition solution was applied by spin coating to a silicon wafer on which an ARC95 (manufactured by Nissan Chemical Co., Ltd.) film with a thickness of 850 angstrom was formed using Clean Track ACT8 (manufactured by Tokyo Electron), and baked (PB) on a hot plate under the conditions shown in Table 2 to obtain a resist film with a thickness of 0.14 μm. The film was exposed through a mask pattern (6% half-tone mask) using an ArF excimer laser exposure apparatus (S306C manufactured by Nikon Corp., lens numerical aperture: 0.78). After subjecting the resist film to PEB under the conditions shown in Table 2 using Clean Track ACT8 (manufactured by Tokyo Electron, Ltd.), the resist film was developed at 25° C. for 60 seconds in a 2.38 mass % tetramethylammonium hydroxide aqueous solution, washed with water, and dried to form a positive-tone resist pattern. A radiation dose (mask bias: 40 nm) at which the diameter of 0.13 μm of a contact hole pattern (1H1S) on the mask was reduced to 0.09 μm was regarded as an optimum dose, which was taken as sensitivity (mJ/cm$^2$).

TABLE 2

| | Film thickness (mm) | Substrate | PB Temp (° C.) | PB Time (Sec) | PEB Temp (° C.) | PEB Time (Sec) |
|---|---|---|---|---|---|---|
| Example 1 | 0.14 | ARC95 | 100 | 60 | 105 | 60 |
| Example 2 | 0.14 | ARC95 | 100 | 60 | 105 | 60 |
| Example 3 | 0.14 | ARC95 | 110 | 60 | 120 | 60 |

TABLE 2-continued

|  | Film thickness (mm) | Substrate | PB Temp (° C.) | PB Time (Sec) | PEB Temp (° C.) | PEB Time (Sec) |
|---|---|---|---|---|---|---|
| Comparative Example 1 | 0.14 | ARC95 | 100 | 60 | 105 | 60 |
| Comparative Example 2 | 0.14 | ARC95 | 100 | 60 | 115 | 60 |

<Resolution>

The minimum dimension (diameter) of the resist pattern resolved at the optimum dose was taken as the resolution.

<Radiation Transmittance>

The composition solution was applied to a quartz glass plate by spin coating and the film was pre-baked on a hot plate which was maintained under the temperature conditions shown in Table 2 to obtain a resist film with a thickness of 0.14 μm. The radiation transmittance (%) was calculated from absorbance at a wavelength of 193 nm and adopted as a standard for transparency in the deep UV ray region.

<EL (Exposure Latitude)>

The composition solution was applied by spin coating to a silicon wafer on which an ARC95 (manufactured by Nissan Chemical Co., Ltd.) film with a thickness of 850 angstrom was formed using Clean Track ACT8 (manufactured by Tokyo Electron), and baked (PB) on a hot plate under the conditions shown in Table 2 to obtain a resist film with a thickness of 0.14 μm. The film was exposed at a prescribed dose through a mask pattern (6% half-tone mask) using an ArF excimer laser exposure apparatus (S306C manufactured by Nikon Corp., lens numerical aperture: 0.78). After performing PEB under the conditions shown in Table 2 using Clean Track ACT8 (manufactured by Tokyo Electron, Ltd.), the resist film was developed at 25° C. for 60 seconds in a 2.38 mass % tetramethylammonium hydroxide aqueous solution, washed with water, and dried to form a positive-tone resist pattern [contact hole pattern (1H1S, diameter: 0.09 μm)].

The size of the contact holes was plotted while changing the exposure dose at 0.5 mJ/cm$^2$ steps in a range of 25 to 35 mJ/cm$^2$ and the inclination was regarded as EL (nm/mJ). The following evaluation standard was applied.

Good: EL was less than 8.0 nm/mJ
Bad: EL was 8.0 nm/mJ or more

<Roundness>

The composition solution was applied by spin coating to a silicon wafer on which an ARC95 (manufactured by Nissan Chemical Co., Ltd.) film with a thickness of 850 angstrom was formed using Clean Track ACT8 (manufactured by Tokyo Electron), and baked (PB) on a hot plate under the conditions shown in Table 2 to obtain a resist film with a thickness of 0.14 μm. The film was exposed at an optimum exposure dose through a mask pattern (6% half-tone mask) using an ArF excimer laser exposure apparatus (S306C manufactured by Nikon Corp., lens numerical aperture: 0.78). After performing PEB under the conditions shown in Table 2 using Clean Track ACT8 (manufactured by Tokyo Electron, Ltd.), the resist film was developed at 25° C. for 60 seconds in a 2.38 mass % tetramethylammonium hydroxide aqueous solution, washed with water, and dried to form a positive-tone resist pattern [contact hole pattern (1H1S, diameter: 0.09 μm)].

The diameters of 16 holes of the contact hole pattern were measured using "SEM S-9380" (manufactured by Hitachi, Ltd.) and Offline CD Measurement Software (Version 5.03). The same measurement was carried out on 20 contact holes, and the three time value (3σ) of the resulting average standard deviation (σ) was calculated to evaluate the roundness according to the following standard.

Good: 3σ was 4.0 or less.
Bad: 3σ was more than 4.0.

<CD Uniformity>

Positive-tone resist patterns [contact hole patterns (1H1S, diameter: 0.09 μm)] were formed in the same manner as in the above roundness evaluation.

The diameters of the contact hole patterns were measured at 20 locations using "SEM S-9380" (manufactured by Hitachi, Ltd.). The three time value (3σ) of the average standard deviation (σ) was calculated based on the result. The CD Uniformity was evaluated using the resulting three time value as follows.

Good: 3σ was 10 or less.
Bad: 3σ was more than 10.

TABLE 3

|  | Sensitivity (mJ/cm$^2$) | Resolution (μm) | Radiation transmittance | EL (nm/mJ) | Roundness | CD uniformity |
|---|---|---|---|---|---|---|
| Example 1 | 25 | 0.09 | 71 | 5.4 (Good) | 3.2 (Good) | 5.6 (Good) |
| Example 2 | 29 | 0.09 | 71 | 7.1 (Good) | 3.8 (Good) | 4.8 (Good) |
| Example 3 | 30 | 0.09 | 71 | 3.0 (Good) | 3.5 (Good) | 6.0 (Good) |
| Comparative Example 1 | 26 | 0.09 | 71 | 8.7 (Bad) | 5.2 (Bad) | 10.3 (Bad) |
| Comparative Example 2 | 24 | 0.09 | 71 | 8.2 (Bad) | 5.8 (Bad) | 12.1 (Bad) |

The composition according to the embodiments of the present invention not only has basic resist properties such as high transparency to radiation, high sensitivity, and high resolution required as a chemically-amplified resist responsive to radiation particularly deep ultraviolet rays represented by an ArF excimer laser (wavelength 193 nm), but also (i) produces an excellent pattern profile particularly by exhibiting extremely excellent roundness of holes in a contact hole pattern (C/H pattern), and (ii) exhibits good CD uniformity in terms of pattern shape and size in a wafer plane. The resin composition can be an ideal material for manufacturing semiconductor devices in which miniaturization is expected to advance in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:
(A) an acid labile group-containing resin, which becomes alkali-soluble by an action of an acid, and which comprises a repeating unit having a lactone skeleton;
(B) a radiation-sensitive acid generator; and
(C) a solvent,
the resin (A) comprising repeating units shown by formulas (1) and (2),

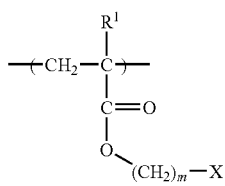

(1)

wherein $R^1$ represents a hydrogen atom or an unsubstituted methyl group, X represents a hydroxyl group, and m represents an integer from 1 to 18,

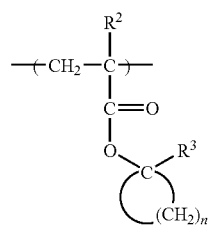

(2)

wherein, $R^2$ represents a hydrogen atom or an unsubstituted methyl group, $R^3$ represents a substituted or unsubstituted alkyl group having 1 to 4 carbon atoms, and n represents an integer from 4 to 8,
wherein a content of the repeating unit shown by formula (1) in the resin (A) is from 5 to 20 mol %, a content of the repeating unit shown by formula (2) in the resin (A) is from 5 to 50 mol %, and a content of the repeating unit having a lactone skeleton in the resin (A) is not more than 41.9 mol %,
wherein the repeating unit shown by the formula (2) comprises at least one repeating unit selected from repeating units derived from compounds shown by formulas (M-2-1) and (M-2-2),

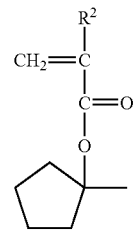

(M-2-1)

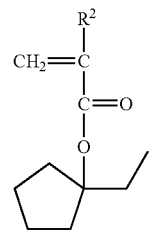

(M-2-2)

wherein $R^2$ represents a hydrogen atom or an unsubstituted methyl group,
wherein the repeating unit having a lactone skeleton in the resin (A) is derived from a compound shown by a formula (M-3),

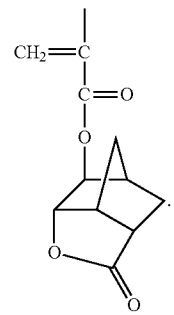

(M-3)

2. The composition according to claim 1, wherein the resin (A) further comprises at least one repeating unit selected from repeating units shown by formulas (3-1), (3-2), (3-3), and (3-4),

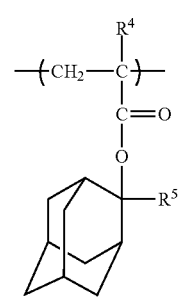

(3-1)

-continued (3-2)

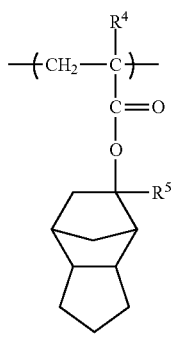

(3-3)

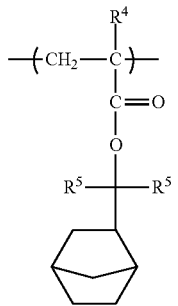

(3-4)

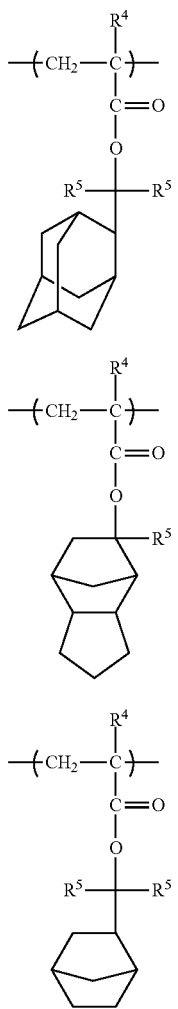

wherein $R^4$ represents a hydrogen atom or a substituted or unsubstituted alkyl group having 1 to 4 carbon atoms, $R^5$ represents a substituted or unsubstituted alkyl group having 1 to 4 carbon atoms, and, if plural $R^5$ groups exist in a single repeating unit among the repeating units, the plural $R^5$ groups are either same or different.

3. The composition according to claim 2, wherein the composition is used for forming a contact hole pattern.

4. The composition according to claim 1, wherein the composition is used for forming a contact hole pattern.

5. The composition according to claim 1, wherein the solvent (C) comprises at least one of linear or branched ketones, cyclic ketones, propylene glycol monoalkyl ether acetates, alkyl 2-hydroxypropionates, alkyl 3-alkoxypropionates, and γ-butyrolactone.

6. The composition according to claim 1, further comprising: an acid diffusion controller.

7. The composition according to claim 6, wherein the acid diffusion controller comprises a nitrogen-containing compound.

8. A pattern forming method comprising:

applying the composition according to claim 1 to a substrate to form a resist film; and exposing and developing the resist film.

9. The pattern forming method according to claim 8, wherein the resist film is heated after exposure.

10. The pattern forming method according to claim 8, wherein the resist film is exposed using a liquid immersion lithographic method, and wherein a liquid immersion protective film is provided on the resist film.

\* \* \* \* \*